United States Patent [19]

Chang et al.

[11] 4,137,542

[45] Jan. 30, 1979

[54] SEMICONDUCTOR STRUCTURE

[75] Inventors: Leroy L. Chang, Mohegan; Leo Esaki, Chappaqua, both of N.Y.

[73] Assignee: International Business Machines Corporation, Armonk, N.Y.

[21] Appl. No.: 789,158

[22] Filed: Apr. 20, 1977

[51] Int. Cl.² .......................................... H01L 29/161
[52] U.S. Cl. .......................................... 357/16; 357/3; 357/58; 357/88
[58] Field of Search .......................... 357/16, 88, 58, 3

[56] References Cited

U.S. PATENT DOCUMENTS

| | | | |
|---|---|---|---|
| 3,469,154 | 9/1969 | Scholer | 317/234 |
| 3,626,257 | 12/1971 | Esaki | 357/88 |
| 3,626,328 | 12/1971 | Esaki | 357/88 |
| 3,882,533 | 5/1975 | Döhler | 357/58 |
| 3,893,148 | 7/1975 | Madjid | 357/16 |

OTHER PUBLICATIONS

Chang et al., *Appl. Phys. Lett.*, vol. 24, No. 12, 15 Jun. 74, pp. 593–595.
Rideout, *IBM Tech. Discl. Bull.*, vol. 13, No. 11, Apr. 1971.

*Primary Examiner*—Martin H. Edlow
*Attorney, Agent, or Firm*—Alvin J. Riddles

[57] ABSTRACT

A semiconductor structure may be fabricated that confines current flow to two dimensions by constructing as a structure a body of alternate regions of different semiconductor materials with current flow parallel to the intersections of the regions. The structure, in device form, exhibits the properties of selectable energy gap, higher carrier mobility and increased electronic density of states. Such devices are usable for their bulk properties, their junction electro-optical properties and their junction transistor properties.

8 Claims, 6 Drawing Figures

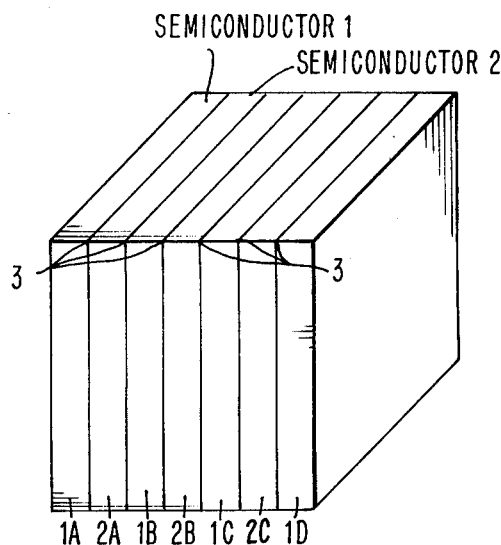
FIG. 1A
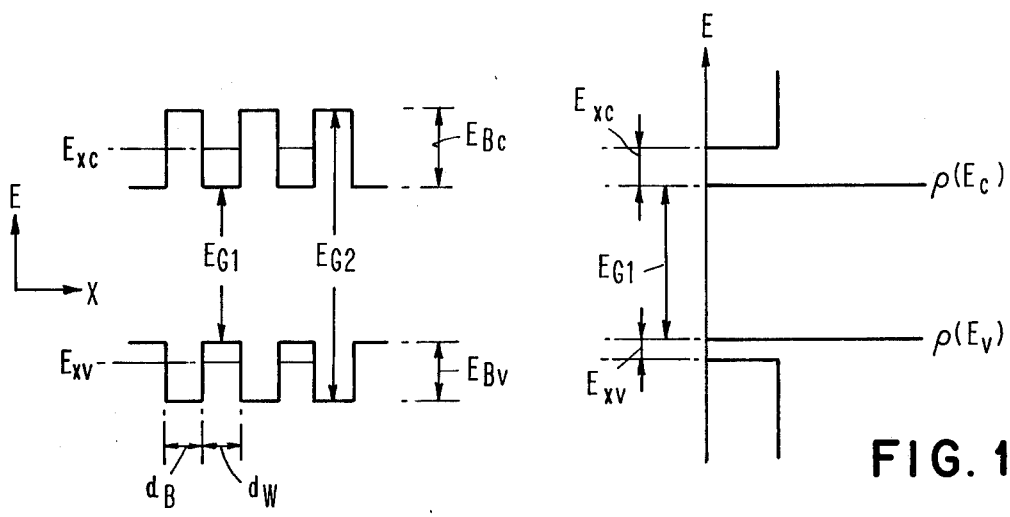
FIG. 1B
FIG. 1C
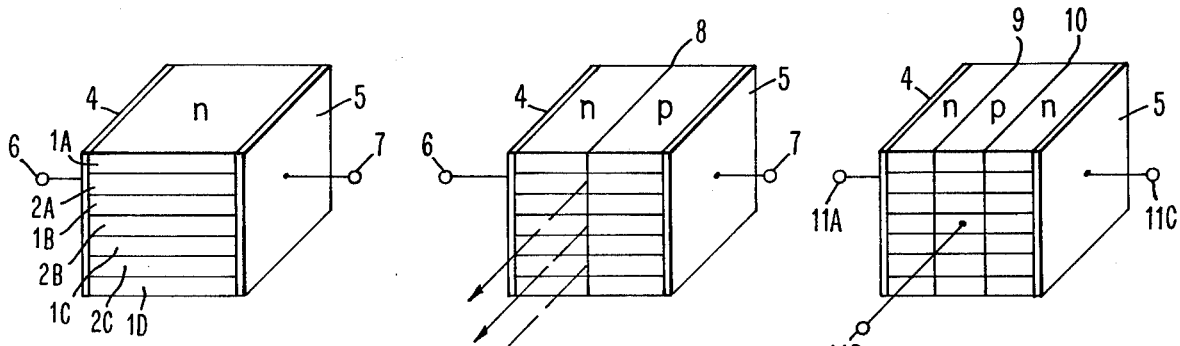
FIG. 2
FIG. 3
FIG. 4

SEMICONDUCTOR STRUCTURE

The government has rights in this invention pursuant to contract No. DAAG29-76-C-0032 awarded by the United States Army Research department.

BACKGROUND OF THE INVENTION

In fabricating semiconductor structures there has heretofore been a limitation in that the movement of the carriers that support conduction through the device may occur in all directions in a particular region. This has resulted in losses that are responsible for many device performance limitations.

SUMMARY OF THE INVENTION

Semiconductor structures may be fabricated by forming the body of heteroregions in planes parallel to the direction of conduction so that carrier movement is essentially confined to two dimensions. The resulting structure then exhibits the properties of higher carrier mobility, higher electronic density of states and a selectable energy gap. The properties of the structure in turn then achieve the device benefit objects of improved bulk performance, improved junction optoelectronic performance and improved junction transistor performance.

DESCRIPTION OF THE DRAWINGS

FIG. 1A is an illustration of the structure of the invention.

FIGS. 1B and 1C are energy level diagrams correlated with the structure of FIG. 1A.

FIG. 2 is an illustration of an n-type bulk semiconductor device employing the invention.

FIG. 3 is an illustration of an n-p junction opto-electronic semiconductor device employing the invention.

FIG. 4 is an illustration of an n-p-n junction transistor device employing the invention.

DETAILED DESCRIPTION OF THE INVENTION

There are a class of semiconductor structures known as supperlattices wherein the structure is an alternating periodic series of layers of two semiconductors. A two dimensional conduction semiconductor structure may be made in accordance with the invention by providing a superlattice structure of two semiconductor materials with regions of alternating energy gaps and where the width of the regions is a small portion of the electron mean free path. In the resulting structure carriers are essentially confined to flow in layered planes thus resulting in essentially two dimensional conduction. In such a structure the potential energy at the interface between the two semiconductors exhibits a sharp change or discontinuity which may be described as a potential well or barrier which confines the carriers.

Referring now to FIGS. 1A, 1B and 1C a monocrystalline semiconductor body is shown made of a superlattice of alternating regions of a first semiconductor 1A–D with regions of a second semiconductor 2A–2C.

In FIG. 1B the potential varies from region to region with energy gaps labeled $E_{G1}$ and $E_{G2}$ and barriers labeled $E_{Bc}$ and $E_{Bv}$. In FIGS. 1B and 1C are shown energy level diagrams which graphically illustrate the potential conditions along the X direction within the body. The alternating regions 1A–D and 2A–C are epitaxially joined along planes separated by demarcation lines 3 in the Y-Z direction.

In accordance with the invention it is necessary to create bound states that confine the electron flow to the layered planes in the Y-Z direction of the body. There are three elements requiring control in order to meet the criteria of the invention. The first, the potential well width, labeled $d_W$ in FIG. 1B, is made comparable to an electron wavelength. This is accomplished by control of the thickness dimension of the regions 1B and 1C of the body. The second, the barrier width, $d_B$ in FIG. 1B, is sufficiently large to confine electron waves to the wells. This is accomplished by control of the dimension of the regions 2A, 2B and 2C of the body. The third criteria, the barrier height, labeled $E_{Bc}$ in FIG. 1B, is made sufficiently high to confine the electron waves to the wells. This is accomplished by the choice of semiconductor materials for the regions 1A–D and 2A–C. The combination of the three criteria operates to create discrete bound states, labeled $E_{xc}$ in FIGS. 1B and 1C, which permit electrons to flow only in the layered planes Y-Z perpendicular to the direction of the potential profile, thus resulting in two dimensional conduction. The potential diagrams of FIGS. 1B and C illustrates the lowest of such bound states for electrons in the conduction band labeled $E_{xc}$ and holes in the valence band labeled $E_{xv}$. The energy difference between $E_{xc}$ and $E_{xv}$ is defined as the effective energy gap of the superlattice.

In a typical structure, in accordance with the invention where the regions 1A–D are of GaAs and the regions 2A–C are of GaAlAs, and the thickness of regions 1B–C and 2A–C are about 100Å, the barrier height $E_{Bc}$ will be about a 0.5 of an electron volt.

Suitable combinations of semiconductors for the construction of the thin, periodic layers include, for example, GaAs-AlAs, GaSb-AlSb, InAs-GaSb, GaAs-ZnSe, GaSb-ZnTe and InSb-CdTe, and their respective alloys such as GaAs-Ga$_{1-x}$Al$_x$As. These semiconductors are selected on the basis of two considerations: that the two semiconductors have a close lattice matching which is required to produce high-quality and defect-free epitaxial films; and that the semiconductor constituting the potential wells has a direct energy gap which is necessary for intense light emission in the operation of the opto-electronic device.

The resulting two dimensional conduction body structure, as shown in FIG. 1A wherein current flow is in the Y-Z direction, provides very beneficial capabilities in the construction of devices. Referring to FIG. 1C it may be seen that the density of states increases as compared to the ordinary three dimensional conduction case and becomes independent of energy. This permits the two dimensional conductivity type semiconductor structure of the invention to effectively behave as one with an effective large and variable energy gap and density of states. Further, the loss of motion in the X direction reduces the kinetic energy of the carriers and hence a higher mobility and a larger diffusivity is realized under the usual conditions where the scattering time is inversely proportional to a certain power of the kinetic energy.

An illustration of the application of the beneficial properties of the invention are set forth in connection with FIGS. 2, 3 and 4.

Referring next to FIG. 2 there is shown a bulk semiconductor device of the type commonly known as the Gunn oscillator. This device in accordance with this invention is made up of a series of layers of two semiconductor materials in order to produce the energy conditions set forth in FIGS. 1B and 1C. The device is shown for illustration purposes to be of n-type conductivity and electrodes 4 and 5 with leads 6 and 7, are current for current transport purposes. The electrodes 4 and 5 may be solder layers. The frequency of oscillation depends on the transit time of the carriers and where the device has the high mobility, achievable with the two dimensional conduction as set forth in the invention, considerable increase in frequencies results. Since in operation, a device of this type operates by an electron transfer process between the fundamental band and an upper-lying band in the usual three dimensional case, the device of this invention, by raising the fundamental band relative to the upper one as shown in FIGS. 1B and 1C controls and lowers the threshold. The faster drift velocity reduces carrier transit time and raises the operating frequency.

Referring next to FIG. 3 an opto-electronic device is set forth wherein an n-p junction labeled element 8 is introduced into the device. The light shown as arrows emanates from the part of the body adjacent to the junction 8.

As set forth, in accordance with the invention the two dimensional carrier conduction produces a much higher density of states than heretofore available which in this structure permits greater electrical to light energy conversion efficiency. The light output frequency of an opto-electronic device as shown in FIG. 3 is largely governed by the size of the energy gap of the semiconductor material and thus since the structure of the invention is effectively selectable, considerable flexibility in this field is provided.

Referring next to FIG. 4 two p-n junctions are introduced and are labeled elements 9 and 10 to provide an n-p-n transistor. In the device of FIG. 4 emitter, base and collector connections labeled 11A,B and C are provided. In a transistor the frequency is governed, among other factors, by the transit time of the carriers in the base and the drift time in the collector. Hence, where the two dimensional conduction conditions of the invention are provided, high diffusivity and drift velocity shorten the transmit time in the base and the drift in the collector. In transistors of this type it is desirable to have a high common emitter gain. The high mobility property of the structure of the invention contributes to this type of gain. Also in a transistor of the type set forth in FIG. 4 it is desirable to eliminate lateral current flow and this is done by the barriers set forth in connection with the structure of the invention.

Structures employing the invention may readily be fabricated using the technique of molecular beam epitaxy. With this technique it is possible to fabricate the thin, periodic layers. Molecular beams are generated in an ultrahigh vacuum system in effusion-type ovens containing the constituent elements of the semiconductors as well as desirable dopants. The beams, through guidance of orifices, are directed toward the substrate where growth is taking place under proper kinetic conditions. Individual shutters are provided for each beam, whose operation is controlled by either feedback circuits or, as in our case, a digital computing system. One set of shutters is opened while the other is closed to grow one semiconductor. When a predetermined thickness is reached for this semiconductor, the situation is reversed to grow the second semiconductor; and the operation is repeated to result in the periodic structure. The molecular beam epitaxy technique can produce extremely smooth films and be precisely controlled; both features being required for the success of the periodic structure. Also important is the relatively low substrate temperature used in this technique, as compared to other epitaxial techniques such as liquid-phase or chemical vapor deposition, which makes thermal diffusion effect negligible so that abrupt structures can be achieved.

To control the p- and/or n-regions for the junction structures during deposition, the geometry of the dopant ovens can be designed to give rise to highly directional beams and mechanical masks with proper shadow effect can also be incorporated. Conventional diffusion techniques can be used after deposition, if the diffusion temperature and time involved do not upset the periodic structure significantly. Ion-implantation is also a promising candidate.

While the structures of FIGS. 2, 3 and 4 are shown for illustration purposes as a block with a junction therein, it will be apparent to one skilled in the art that it will be possible to produce the structure in a large scale integration three dimensional mode by laying down alternate layers in angstrom thicknesses of the structure set forth in FIG. 1A.

What has been set forth are structural principles that in combination operate to confine carrier flow in a semiconductor device to only two of the usual three possible dimensions and illustrations have been provided applying the advantages of two dimensional conduction to the performance characteristics of several typical semiconductor devices.

What is claimed is:

1. A semiconductor device comprising in combination:
   a semiconductor body said body made up of
   alternating epitaxial planar regions of at least first and second semiconductor materials exhibiting a difference in semiconductor carrier barrier height at each interface of said planar regions;
   each of said planar regions having a thickness dimension less than the mean free path of an electron; and
   at least input and output means positioned for introducing current flow in the regions of said body parallel to the interfaces between said regions.

2. The semiconductor device of claim 1 wherein said two semiconductor materials are taken from the following group of combinations and their alloys: GaAs-AlAs, GaSb-AlSb, InAs-GaSb, GaAs-ZnSe, GaSb-ZnTe and InSb-CdTe.

3. The semiconductor device of claim 2 wherein the thickness dimension of said first and said second planar regions is in the vicinity of 100Å.

4. The semiconductor device of claim 2 wherein the thickness dimension of said first and second planar regions is in the vicinity of 100Å.

5. The semiconductor device of claim 1 wherein said semiconductor body includes a portion of p-type conductivity in all planar regions and a portion of n-type conductivity in all planar regions joined at a p-n junction that traverses all planar regions and is positioned serially between said input and said output means.

6. The semiconductor device of claim 2 wherein said semiconductor body includes a portion of p-type conductivity in all planar regions and a portion of n-type conductivity in all planar regions joined at a p-n junction that traverses all planar regions and is positioned serially between said input and said output means.

7. The semiconductor device of claim 1 wherein said semiconductor body includes in each planar region first and second external and one internal portion of alternating conductivity type intersecting at two p-n junctions sufficiently proximate for transistor action;
　signal input means connected to said first external conductivity type portion;
　signal output means connected to said second external conductivity type portions, and
　signal means connected to said internal conductivity type portion.

8. The semiconductor device of claim 2 wherein said semiconductor body includes in each planar region first and second external and one internal portion of alternating conductivity type intersecting at two p-n junctions sufficiently proximate for transistor action;
　signal input means connected to said first external conductivity type portion;
　signal output means connected to said second external conductivity type portions, and
　signal means connected to said internal conductivity type portion.

* * * * *